(12) United States Patent
Kyösti et al.

(10) Patent No.: US 9,488,685 B2
(45) Date of Patent: Nov. 8, 2016

(54) OVER-THE-AIR TEST

(75) Inventors: Pekka Kyösti, Jokirinne (FI); Jukka-Pekka Nuutinen, Martinniemi (FI); Juhamatti Malm, Helsinki (FI)

(73) Assignee: Keysight Technologies Singapore (Holdings) Pte. Ltd., Singapore (SG)

( * ) Notice: Subject to any disclaimer, the term of this patent is extended or adjusted under 35 U.S.C. 154(b) by 206 days.

(21) Appl. No.: 13/638,340

(22) PCT Filed: May 24, 2010

(86) PCT No.: PCT/FI2010/050419
§ 371 (c)(1),
(2), (4) Date: Sep. 28, 2012

(87) PCT Pub. No.: WO2011/148030
PCT Pub. Date: Dec. 1, 2011

(65) Prior Publication Data
US 2013/0059545 A1 Mar. 7, 2013

(51) Int. Cl.
*H04B 17/00* (2015.01)
*G01R 29/10* (2006.01)
*H01Q 3/24* (2006.01)
*H01Q 21/20* (2006.01)
*H04B 7/06* (2006.01)
*H04B 7/08* (2006.01)

(52) U.S. Cl.
CPC ............ *G01R 29/105* (2013.01); *H01Q 3/24* (2013.01); *H01Q 21/20* (2013.01); *H04B 7/0691* (2013.01); *H04B 17/0087* (2013.01); *H04B 7/0874* (2013.01)

(58) Field of Classification Search
CPC H04W 24/00; H04W 24/08; H04B 17/0042; H04B 17/0057; H04L 1/0026
USPC .............. 455/67.11, 67.12, 63.4, 550.1, 561, 455/562.1, 575.1, 575.7
See application file for complete search history.

(56) References Cited

U.S. PATENT DOCUMENTS

| | | | |
|---|---|---|---|
| 6,208,841 B1 * | 3/2001 | Wallace et al. | ............ 455/67.12 |
| 7,369,982 B2 * | 5/2008 | Leaming | .......................... 703/25 |
| 8,446,256 B2 * | 5/2013 | Pinkham | ...................... 340/10.3 |

FOREIGN PATENT DOCUMENTS

| | | |
|---|---|---|
| JP | 2005354319 A | 12/2005 |
| JP | 2010025787 A | 2/2010 |
| JP | 2011087114 | 4/2011 |
| WO | 2010040887 | 4/2010 |
| WO | 2010040889 | 4/2010 |

(Continued)

OTHER PUBLICATIONS

International Preliminary Report, International Application No. PCT/FI2010/050419, Ville Mottonen, Aug. 20, 2012, 16 pages.

(Continued)

*Primary Examiner* — Nhan Le

(57) ABSTRACT

An emulating system of an over-the-air test comprises a radio channel emulator, a selector, a connector and a plurality of antenna elements placed around a test spot for an electronic device under test. The selector receives data on a simulated radio channel from the radio channel emulator and selects a subset of a plurality of positions of antenna elements on the basis of the data. The connector connects only the antenna elements in the subset and the radio channel emulator for physically realizing the simulated radio channel.

23 Claims, 7 Drawing Sheets

(56) References Cited

FOREIGN PATENT DOCUMENTS

| WO | 2010040889 A1 | 4/2010 |
|---|---|---|
| WO | WO2010040889 A1 | 4/2010 |

OTHER PUBLICATIONS

Kyosti, et al., "MIMO OTA Test concept with Experimental and Simulated Verification", 2010 Proceedings of the Fourth European Conference on Antennas and Propagation, pp. 1-5 (Apr. 12, 2010).
Laitinen et al., "On the Number of OTA Antenna elements for Plane-Wave Synthesis in a MIMO-OTA Test System Involving a Circular Antenna Array", 2010 Proceedings of the Fourth European Conference on Antennas and Propagation, pp. 1-5 (Apr. 12, 2010).
Okano et al., "Impact of Number of Probe Antennas for MIMO OTA Spatial Channel Emulator", 2010 Proceedings of the Fourth European Conference on Antennas and Propagation, pp. 1-5 (Apr. 12, 2010).
Extended European Search Report, European Application No. 10852065.1, dated Nov. 14, 2013, 3 pages.
Extended European Search Report for Application No. PCT/FI2010/050419 dated Nov. 14, 2013.
Office Action, Korean Application No. 10-2012-7027373, dated Dec. 19, 2013, 5 pages.
International Search Report dated Feb. 25, 2011 for PCT Application No. PCT/FI2010/050419.
William H. Press, "Simulated Annealing Methods" Section 10.9 of the book "Numerical Recipes in C—The Art of Scientific Computing", Cambridge University Press, Second Edition (1992), pp. 444-445.
Extended European Search Report dated Nov. 14, 2013 for European Patent Application No. 10852065.1.
Office Action dated Nov. 22, 2013 in Japanese Patent Application No. 2013-505505 (Unofficial/non-certified English language translation provided by foreign agent).
Office Action dated Mar. 21, 2014 in Korean Patent Application No. 10-2012-7027373 (Unofficial/non-certified English language translation provided by foreign agent).
English language machine translation of JP2011087114, published Apr. 28, 2011.

\* cited by examiner

OVER-THE-AIR TEST

CROSS-REFERENCE TO RELATED APPLICATION

This application is a National Stage application of International Application No. PCT/FI2010/050419, filed May 24, 2010, which is incorporated by reference herein in its entirety.

FIELD

The invention relates to an over-the-air testing of a device in an anechoic chamber.

DESCRIPTION OF THE RELATED ART

When a radio frequency signal is transmitted from a transmitter to a receiver, the signal propagates in a radio channel along one or more paths having different angles of arrivals, signal delays, polarizations and powers, which cause fadings of different durations and strengths in the received signal. In addition, noise and interference due to other transmitters interfere with the radio connection.

A transmitter and a receiver can be tested using a radio channel emulator emulating real circumstances. In a digital radio channel emulator, a radio channel is usually modeled with an FIR filter (Finite Impulse Response). A traditional radio channel emulation test is performed via a conducted connection such that a transmitter and a receiver are coupled together via a cable.

Communication between a subscriber terminal and a base station of a radio system can be tested using an OTA (Over The Air) test, where a real DUT (Device Under Test) is surrounded by a plurality of antenna elements of an emulator in an anechoic chamber. The emulator may be coupled to or act as a base station and emulate paths between the subscriber terminal and the base station according to a channel model. Between each antenna and the emulator there is an antenna-element-specific channel. Often a lot of antenna elements and hence a lot of antenna-element-specific channels are needed. The reason for a high number of antenna elements may be a need for a large enough quiet zone in the test chamber. However, when the number of antenna-element-specific channels increases, the testing system becomes more complicated and expensive. Hence, there is a need for a better testing system.

SUMMARY

The following presents a simplified summary of the invention in order to provide a basic understanding of some aspects of the invention. This summary is not an extensive overview of the invention. It is not intended to identify key elements of the invention or to delineate the scope of the invention. Its sole purpose is to present some concepts of the invention in a simplified form as a prelude to the more detailed description that is presented later.

An aspect of the invention relates to a method, the method comprising selecting a subset of positions of antenna elements from a plurality of potential positions of antenna elements around the device under test on the basis of a simulated radio channel in an over-the-air test; and connecting only the antenna elements in the subset and the radio channel emulator together for physically realizing the simulated radio channel.

A further aspect of the invention relates to a connection system, the connection system comprising a selector placable between an emulator and a plurality of antenna elements around an electronic device under test for a wireless connection between the electronic device under test and the emulator through a simulated radio channel of the emulator; and the selector is configured to receive data on the simulated radio channel from the emulator and to select a subset of positions of antenna elements from a plurality of potential positions of antenna elements for connection on the basis of the data.

A further aspect of the invention is an emulating system of an over-the-air test, the emulating system comprising a radio channel emulator, a selector, a connector and a plurality of antenna elements placed around a test spot for an electronic device under test; the selector is configured to receive data on the simulated radio channel from the emulator and to select a subset of positions of antenna elements from a plurality of potential positions of antenna elements for connection on the basis of the data; and the connector is configured to connect only the antenna elements of the subset and the radio channel emulator for physically realizing the simulated radio channel.

Although the various aspects, embodiments and features of the invention are recited independently, it should be appreciated that all combinations of the various aspects, embodiments and features of the invention are possible and within the scope of the present invention as claimed.

The invention provides an accurate angular power distribution with a low number of antenna-element-specific channels and antenna elements.

BRIEF DESCRIPTION OF THE DRAWINGS

In the following the invention will be described in greater detail by means of exemplary embodiments with reference to the attached drawings, in which.

DETAILED DESCRIPTION

Exemplary embodiments of the present invention will now be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments. Therefore, all words and expressions should be interpreted broadly and they are intended to illustrate, not to restrict, each embodiment.

Figure 1A:
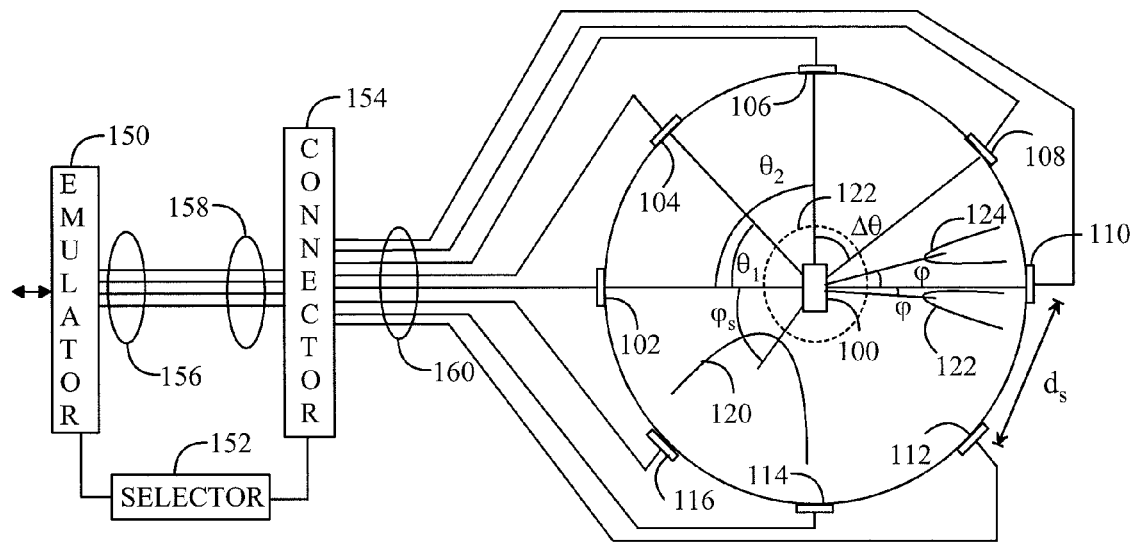
FIG. 1A shows a plane geometrical embodiment of an OTA test chamber.
Figure 1B:
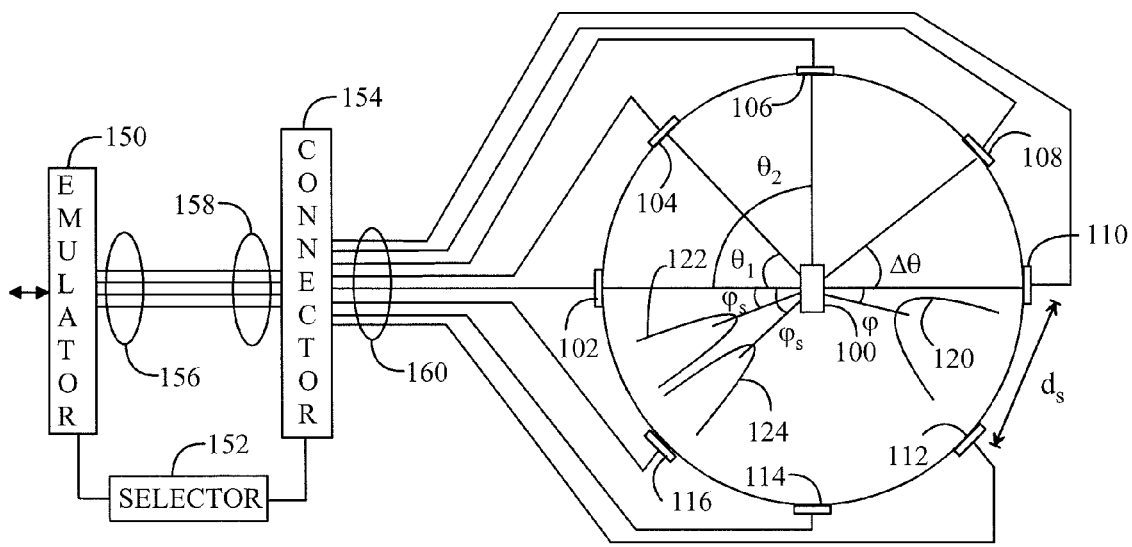
FIG. 1B shows active antenna elements at a different moment.

FIGS. 1A and 1B present a plane geometrical embodiment of an OTA test chamber. As shown in FIG. 1A, a DUT 100, which may be a subscriber terminal, is in the centre and fixed antenna elements 102, 104, 106, 108, 110, 112, 114 and 116 are distributed at a known spacing around a test spot 122 where the DUT 100 may be placed. Let us denote the directions of J OTA antennas with $\theta_k$, k=1, ..., J and the spacing $d_s$ of an antenna in the angle domain with $\Delta\theta$, where J refers to the number of antenna elements 102 to 116. The angle $\Delta\theta$ expresses a measure of the separation of two antenna elements 102 to 116 with respect to the electronic device 100. In general, the spacing $d_s$ may also be non-uniform and the separation angle $\Delta\theta$ may be the same or different for any two successive antenna elements 102 to 116.

The antenna elements 102 to 116 may be at different distances from the DUT 100. Correspondingly, the antenna elements 102 to 116 may only be placed in a sector instead of being placed at a full angle or a full solid angle. The DUT 100 may also have one or more elements in the antenna.

In an embodiment, the antenna elements may continuously move or they may discontinuously be shifted from one place to another place in order to have a higher density of antenna elements in a sector where they are needed at a certain moment.

The test chamber may be an anechoic room. The emulator 150 may comprise at least one FIR filter for forming each antenna-specific channel. Additionally or alternatively, the emulator 150 may comprise a processor, a memory and a suitable computer program for providing the antenna-specific channels.

The emulator 150 has at least one radio channel model one of which may be selected to be used as a simulated radio channel for a test. The simulated radio channel may be selected by a person accomplishing the test. The simulated radio channel used may be a play back model based on a channel recorded from a real radio system or it may be an artificially generated model or it may be a combination of a playback model and an artificially generated model.

Each emulator output port 156 of an emulator 150 such as EB (Elektrobit) Propsim® F8 may be connected to an input 158 port of a connector 154. Similarly, each antenna element 102 to 116 may be connected to an output port 160 of the connector 154. The emulator 150 forms a predetermined number of antenna-element-specific channels of the simulated radio channel. One antenna-element-specific channel is then associated with one antenna element by a connection between the emulator 150 and the antenna element. In general, at least one antenna element 102 to 116 is coupled to the emulator 150.

The emulating system comprises a selector 152. The emulator 150 provides the selector 152 with data on an angular distribution of direction(s) of reception. The data may be given in coordinates where the DUT 100 is the origin and hence the angular data may be expressed relative to the DUT 100 irrespective of whether the data is received by the DUT 100 or the antenna elements. When the antenna elements 102 to 116 are used to transmit a signal to the DUT 100, the DUT 100 is the receiver and the data then includes direct or indirect information on angles $\phi$ of arrivals with respect to the DUT 100. Note that angle $\phi_s$ is defined as $\phi_s=\phi+180°$ for clarity in FIGS. 1 and 2. When the DUT 100 transmits to the antenna elements 102 to 116, the data includes direct or indirect information on the angles $\phi$ of arrivals with respect to the antenna elements 102 to 116. The angles $\phi$ of arrivals may be the directions of beams 120 to 124 to or from the DUT 100. Hence, the angular distribution of the directions of reception may be considered as angular distribution of the beams 120 to 124 and the distribution may be extracted from the simulated radio channel in the emulator 150 or the emulator 150 may feed the simulated radio channel to the selector 152 which may then extract the specific data on the angular distribution of the directions of reception. Two directions of reception (beams 122, 124) may have a narrow angular difference which would, in prior art, mean that in order to realize the resolution of the narrow angular difference, a larger number of antenna elements should be used than is connectable to the emulator 150 or more emulators should be used.

FIG. 1B shows selected antenna elements at a different moment with respect to FIG. 1A. Here, the angles $\phi$ of arrivals between the emulator 150 and the device 100 under test are different from those in FIG. 1A, since clusters in the simulated situation reflect the signals differently. The term cluster refers to multipath signal components occurring in groups having similar values of parameters. The multipath components are due to objects or parts of at least one object which scatter. Clusters are often associated with a MIMO (Multiple-Input and Multiple-Output) channel model but the term may be used in conjunction with other channel modes, too. A cluster may be time variant. In this example, the selector 152 has selected a different subgroup 102, 110, 112, 116 from those in FIG. 1A on the basis of the simulated radio channel to be in connection with the emulator 150.

Figure 2:
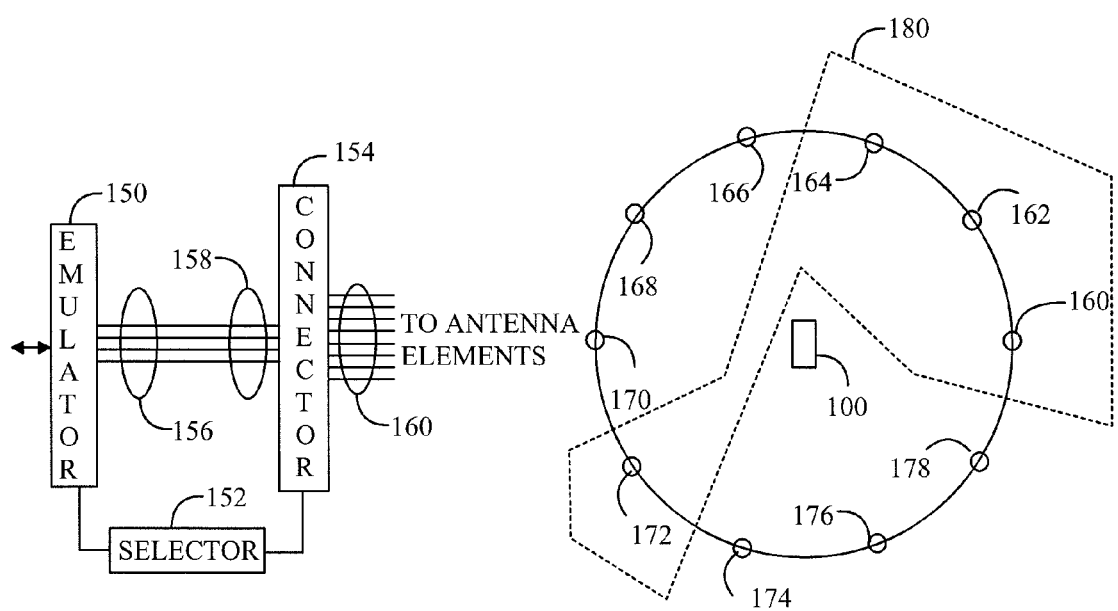
FIG. 2 shows potential positions of antenna elements and an example of subset of selected positions.

In FIG. 2, the antenna elements do not have fixed positions but instead selected antenna elements may be placed in potential positions 160 to 178. The number of potential positions 160 to 178 may be much larger than the number of antenna elements that will be selected for communication. The number of potential positions 160 to 178 may approach infinity if the antenna elements are movable. In an embodiment, the selector 152 may select a subset 180 of positions for antenna elements from a plurality of potential positions 160 to 178 on the basis of a simulated radio channel in an over-the-air test. The number of selected positions in the subset 180 defines also the number of antenna elements that will be used in communication. Hence, if the subset 180 comprises four positions, the number of antenna elements is also four. If more than four antenna elements are available for the communication, the four antenna elements in selected positions of the subset 180 form a selected subgroup of antenna elements.

A connector 154 may connect the antenna elements placed in the positions of the subset 180 and the radio channel emulator 150 together for physically realizing the simulated radio channel. Other antenna elements may be left without a connection with the emulator 150.

Assume now that antenna elements whose number is J are arranged in fixed positions around the DUT 100. Then the selection of positions of antenna elements directly corresponds to the selection of antenna elements. With the data on the angular distribution of the directions of reception (beams 124 to 134), the selector 152 may select a subgroup 108, 110, 114, 116 from the plurality of antenna elements 102 to 116 on the basis of the data. The sub-group has more antenna elements close to each other where the angular difference between directions of reception is narrow, less antenna elements where the angular difference is wider and no antenna elements where no signal is propagating.

The selector 152 feeds data on the subgroup 108, 110, 114, 116 to the connector 154 which connects the subgroup 108, 110, 114, 116 and the radio channel emulator 150 for physically realizing the simulated radio channel between the subgroup 108, 110, 114, 116 and the emulator 150. The selected antenna elements in the subgroup provide at least one angle of arrival $\phi$ for a transmitted signal between the emulator 150 and the DUT 100 which is close enough for the simulation to emulate a situation in a real radio system.

Figure 3:
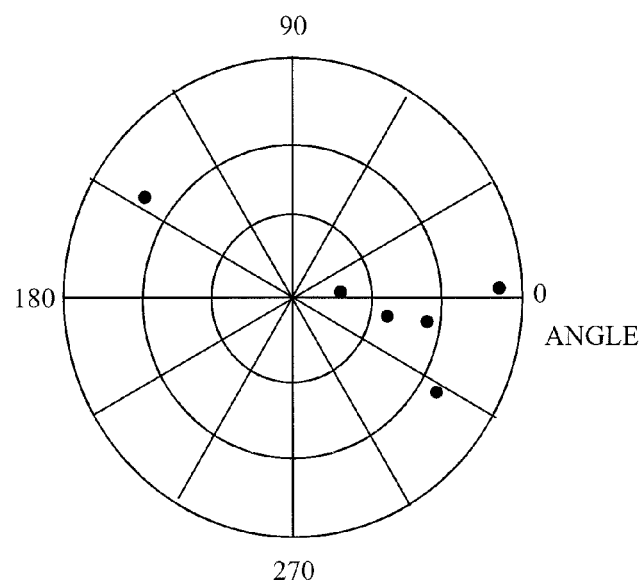
FIG. 3 shows clusters reflecting a signal propagating between a transmitter and a receiver.

FIG. 3 shows clusters (black dots) reflecting a signal propagating between a transmitter and a receiver, the reflections defining the angles of arrival of the signal components to the receiver. It can be seen that many antenna elements should be selected to the subgroup between the angles −30°-0° and maybe only one antenna element is needed in the subgroup for the angle 150°.

The emulating system may intelligently select an appropriate subset 180 of positions of the antenna elements 102 to 116 around the DUT 100 for simulating the clusters by determining a corresponding angular distribution of power transmitted to the receiver. A dense spacing of antenna elements at close angles of arrival results in an accurate reconstruction of a simulated radio channel in the OTA chamber.

The selector 152 has a selection algorithm for selecting the subset 180 of positions of the antenna elements 102 to 116. In a plane geometrical embodiment where the antenna elements 102 to 116 are mounted on an azimuth plane only, a plurality of selection algorithms are potential. In principle, the subset 180 of positions may be selected randomly, but a more realistic selection is a deterministic process. Assume that the number of all available antenna positions or elements is J and the number of output ports of the emulator 150 is K, where J>K. However, the angular resolution of the simulated radio channel may require at a certain sector associated with a dense constellation of clusters that the density of antenna elements in the sector is the same as the density of J antenna elements distributed equally around the DUT. In general, the required angular resolution may even be more accurate but often it is at least more accurate than the equal distribution of K antenna elements around the DUT.

The algorithm in the selector 152 may maximize the size of the quiet zone in the OTA test chamber which provides the required angular resolution for the simulated radio channel. In general, any DUT needs large enough a quiet zone to be tested properly. The larger the device is the larger quiet zone it needs. For example, a lap top requires a larger quiet zone than a small mobile phone. In other words, it may be useful to use an algorithm which maximizes the angular resolution with a minimum number of antenna elements.

First, it is possible to use a brute force method where an optimization of weights $G_{tot}$ of the antenna elements is performed for each possible combination of the antenna elements. Then weights which result in the best fit in terms of spatial correlation, or some other appropriate metric using K antenna elements at maximum, may be selected. However, the number of combination to be tested of the brute force method becomes huge, particularly if J is large and K is small with respect to J.

Instead of brute force, the optimization may be performed in following manner.

In an embodiment, a way to maximize the quiet zone in the OTA test chamber may use an optimization algorithm having a comparison between a theoretical spatial cross correlation $\rho(\Delta_m,\phi,\sigma_\phi)$ of antenna elements and a spatial correlation $\tilde\rho(\Delta_m)$ obtainable with the OTA antenna elements with various weights $G_{tot}=(g_1, g_2, \ldots, g_P)$, where P is K or less. The purpose of the optimization algorithm may be to find a suitable set of weights $G_{tot}$ for K antenna elements. It may also be possible to find a suitable set of weights $G_{tot}$ for a number of antenna elements less than K.

Figure 4:
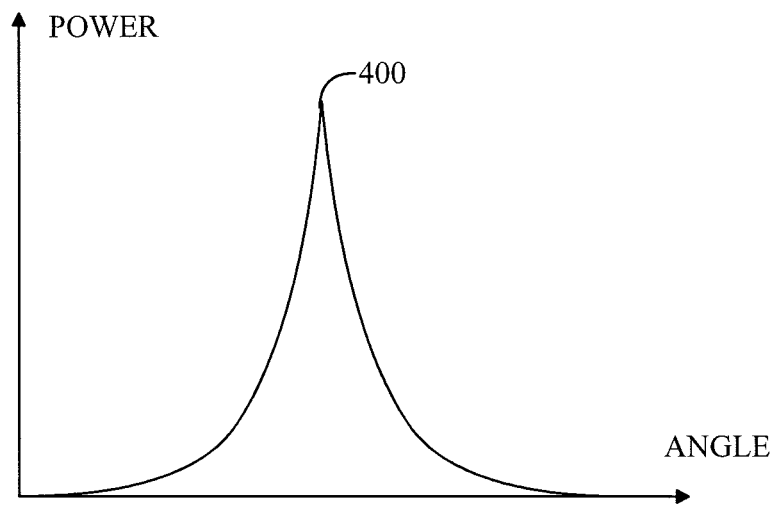
FIG. 4 shows graphically a desired power as a function of angle.

FIG. 4 presents graphically a desired power 400 of one cluster as a function of angle i.e. a PAS (Power Angular Spectrum) around the DUT 100. Power is in the vertical axis and angles are in the horizontal axis. In this example, the PAS is Laplacian shaped. The PAS may be Fourier-transformed, and the result is presented in FIG. 5. The PAS Fourier-transformed PAS results in a spatial correlation function 500. The correlation values are in the vertical axis and the location in wavelengths is in the horizontal axis.

Figure 5:
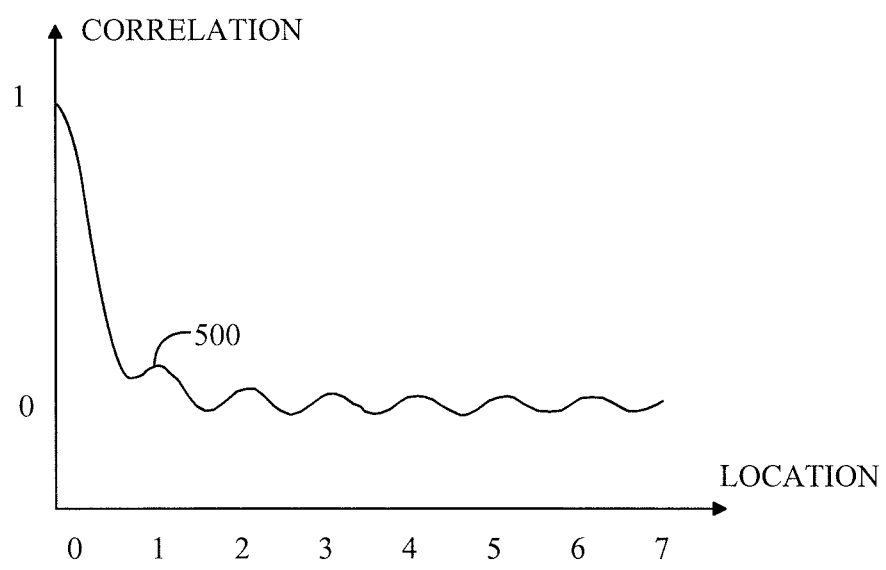
FIG. 5 shows a Fourier-transform of PAS.

Now, the optimization may be performed using spatial correlations such as shown in FIG. 5. The spatial correlation in the OTA test chamber has spatial separations $\Delta_m$, nominal angles of arrival $\phi$, angular spreads $\sigma_\phi$ of angles of arrival as arguments. A spatial separation may be defined as phase distance between two points. Usually the phase distance in the quiet zone is taken into account. The phase distance may be obtained by dividing a distance of two points by a wavelength which may further be multiplied by $2\pi$.

In the optimization algorithm, a cost function such as an $L^2$-norm $E_\rho(g_1, g_2, \ldots, g_J)$ may be optimized for each cluster separately $$E_\rho(g_1, g_2, \ldots, g_J) = \sqrt{\frac{1}{M}\sum_{m=1}^{M} |\rho(\Delta_m, \varphi, \sigma_\varphi) - \tilde\rho(\Delta_m)|^2}, \quad (1)$$

where $\rho(\Delta_m,\phi,\sigma_\phi)$ is a theoretical spatial cross correlation and $\tilde\rho(\Delta_m)$ is a spatial correlation obtained with the OTA antenna elements. The purpose is to determine weights G for selected positions of OTA antenna elements by minimizing the cost function above with respect to various potential weights G of the antenna elements. The algorithm is a way to select the subset 180 from the potential positions 160 to 178 for the antenna elements by an optimization of an error between a theoretical spatial cross correlation and a real spatial correlation achievable with antenna elements of various subsets in the optimization. The optimization algorithm finds a number of antenna elements needed, proper positions for the number of antenna elements needed and a proper weight for each of them. In the case of fixed antenna elements, the position of the antenna element is predefined, however. Alternatively, the optimization of equation (1) may be performed by a gradient method, a half space method or the like.

The theoretical cross correlation function $\rho(\Delta_m, \phi_0, \sigma_\phi)$ for Laplacian shaped PAS (Power Angular Spectrum) may be defined as $$\rho(\Delta_m, \varphi_0, \sigma_\varphi) = \int \exp(-j2\pi\Delta_m \sin(\varphi_0 + \varphi)) \frac{1}{\sqrt{2}\,\sigma_\varphi} \exp\left(\frac{\sqrt{2}\,|\varphi|}{\sigma_\varphi}\right) d\varphi \quad (2)$$

In practice, it can be calculated for truncated Laplacian PAS or by discrete approximation. The spatial correlation obtained with the OTA antenna elements may be defined as $$\tilde{\rho}(\Delta_m, \theta_0) = \left(\sum_{i=1}^{J} g_{k_i}\right)^{-1} \sum_{k=1}^{J} g_{k_i} \exp(-j2\pi\Delta_m \sin\theta_{k_i}) \quad (3)$$

where the term J represents the number of the antenna elements in the iteration and $g_k$ may be limited such that $g_k \subset [0,1]$. The optimization can be performed numerically by applying a binary search in J dimensional space, because equation (1) is a convex function. With a binary search only about $\log_2 L^J = J \log_2 L$ iterations (i.e. computations of eq. (1)) are needed, where L is the number of points of $g_k$.

The equation (1) may be computed by applying (2) and (3) and using numerical optimization methods, such as a gradient method or a half space method.

In order to simplify the notation, let us denote the weights as a vector G $$G = (g_1, g_2, \ldots, g_J), \quad (4)$$

and the set of the phase terms as a vector $A_m$ $$A_m = (a_{m1}, a_{m2}, \ldots, a_{mJ}) \quad (5)$$
$$= (\exp(-j2\pi\Delta_m \sin\theta_1), \exp(-j2\pi\Delta_m \sin\theta_2), \ldots, \exp(-j2\pi\Delta_m \sin\theta_J))$$

and the theoretical cross correlation as a scalar $\rho_m$ $$\rho_m = \rho(\Delta_m, \phi_0, \sigma_\phi). \quad (6)$$

Now $E_\rho$ may be minimized by solving zero of the gradient $$\nabla E_\rho(g_1, g_2, \ldots, g_J) = \quad (7)$$

$$\sum_{k=1}^{J} 2u_k \sum_{m=1}^{M} \left| \rho_m - \frac{G \cdot A}{\sum_{k=1}^{J} g_k} \right| \left( \frac{a_{mk} \sum_{k=1}^{J} g_k - (G \cdot A)J}{\sum_{k=1}^{J} g_k} \right) = 0$$

where $u_k$ is the kth unit base vector. The gradient equation above can be processed to a set of J equations, which may be solved with respect to weights $$\begin{cases} \sum_{m=1}^{M} \left| \rho_m - \frac{G \cdot A}{\sum_{k=1}^{J} g_k} \right| \left( \frac{a_{m1} \sum_{k=1}^{J} g_k - (G \cdot A)J}{\sum_{k=1}^{J} g_k} \right) = 0 \\ \vdots \\ \sum_{m=1}^{M} \left| \rho_m - \frac{G \cdot A}{\sum_{k=1}^{J} g_k} \right| \left( \frac{a_{mJ} \sum_{k=1}^{J} g_k - (G \cdot A)J}{\sum_{k=1}^{J} g_k} \right) = 0 \end{cases} \quad (8)$$

Equation (8) represents an analytical set of equations, i.e. making the gradient (7) zero.

Then the optimization is similarly performed for all other clusters if there are more than one cluster. After obtaining all optimized weights, the weights may be combined by summing the weights as vectors for forming combined weights $G_{tot}$ representing all clusters round the DUT 100. The combined weights $G_{tot}$ may be a vector or a matrix having a weight element for each antenna element in the selected position. Instead of separately performing an optimization for each cluster, it is possible to combine the separate optimizations into one combined optimization operation and have weights $G_{tot}$ without separate summing of weights of clusters.

Then a weight of a minimum value is searched for from the combined weights $G_{tot}$ and when it is found, the position of the antenna element having the weight of the minimum value may be removed from the potential positions 160 to 178 of available antenna elements. This means that the number J of all available positions for antenna elements is reduced by one which may be expressed as follows: J=J−1. In general, more than one position may be removed from the potential positions 160 to 178 for antenna elements. In such a case, a predefined number of weights of smallest values is searched for and the corresponding number of positions of antenna elements is deleted from the potential positions 160 to 178 of antenna elements. In different iterations a different number of positions of antenna elements and their weights may be deleted.

Then the optimization algorithm including the calculation of combined $G_{tot}$ with a lowered number of positions of antenna elements and the removal of the at least one position for an antenna element having the weight of a minimum value is repeated so long that the number of all available positions for antenna elements J reaches or drops below the number of output ports K of the emulator 150. When J≤K, the final values for combined weights $G_{tot}$ are calculated and they are used for simulating a radio channel between the emulator 150 and the DUT 100.

The elimination of at least one position for an antenna element and its weight may not necessarily be based on the value of the weight. In an embodiment, the selection of weights $G_{tot,J-2}$ in the second iteration of the cost function $E_\rho(g_1, g_2, \ldots, g_{J-1})$ may be based on the least change in the value of the cost function when the result of the second cost function $E_\rho(g_1, g_2, \ldots, g_{J-1})$ is compared with the result of the first cost function $E_\rho(g_1, g_2, \ldots, g_J)$. Similarly, the results of the cost functions of the third and later iterations i of the optimization may be compared with the first cost function $E_\rho(g_1, g_2, \ldots, g_J)$ and the weights $G_{tot,J-i}$ causing the least difference may be selected. When J≤K, the final values for combined weights $G_{tot}$ are calculated and they are used for the antenna elements in the selected positions in order to form the simulated radio channel between the emulator 150 and the DUT 100.

Still another possible algorithm is to use a principle similar to a serial interference cancellation (SIC). In this algorithm, the optimization is performed as explained above but instead of the minimum value, the maximum value of a weight $g_k$ of the cost function associated with each cluster is selected and stored. The maximum weights are then combined by summing the values as earlier explained. The iterations of optimizations may then be repeated with increasing number of stored weights. The number J of all available positions of the antenna elements may be increased by one or more whose weight resulted in the highest value. Further, the optimization, storing of the maximum weights and the increase in positions of antenna elements is repeated so long that the number of all available positions for antenna elements reaches or rises for the first time above the number K of ports in the emulator 150. Then the number J of positions for antenna elements are selected where J is the same or less than K since K is the maximum physically possible number of antenna elements. The last iteration may be performed so that the number of removed positions of antenna elements and their weights is such that the number of selected antenna elements becomes exactly K. Finally, the combined weights $G_{tot}$ and the corresponding subset 180 of positions are used for the simulated radio channel between the emulator 150 and the DUT 100. In these examples it is considered that one antenna element is placed in one selected position.

The purpose of the optimization algorithm is to maximize the size of the quiet zone around the DUT 100. By doing that, the testing of a larger DUT with higher angular resolution is supported.

Figure 6:
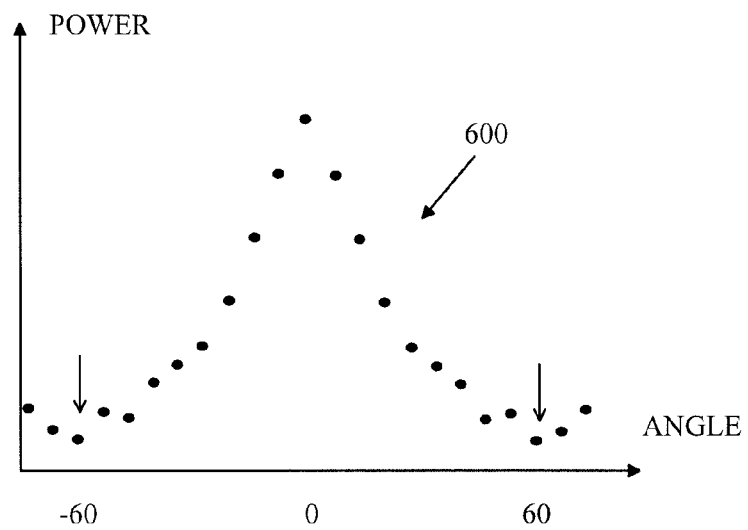
FIG. 6 shows powers of the antenna elements.

FIG. 6 presents powers 600 of the antenna elements. It can also be considered that the distribution in FIG. 6 presents weights G for each available antenna element. The distribution represents discretely inverse-transformed form of the spatial correlation function presented in FIG. 5 by the optimization in the algorithm. For example, when a minimum value is searched for and removed in the algorithm, it means that at least one of the lowest weights near −60° or +60° marked with an arrow is to be removed first before a new recalculation of the iterative optimization algorithm.

Figure 7:
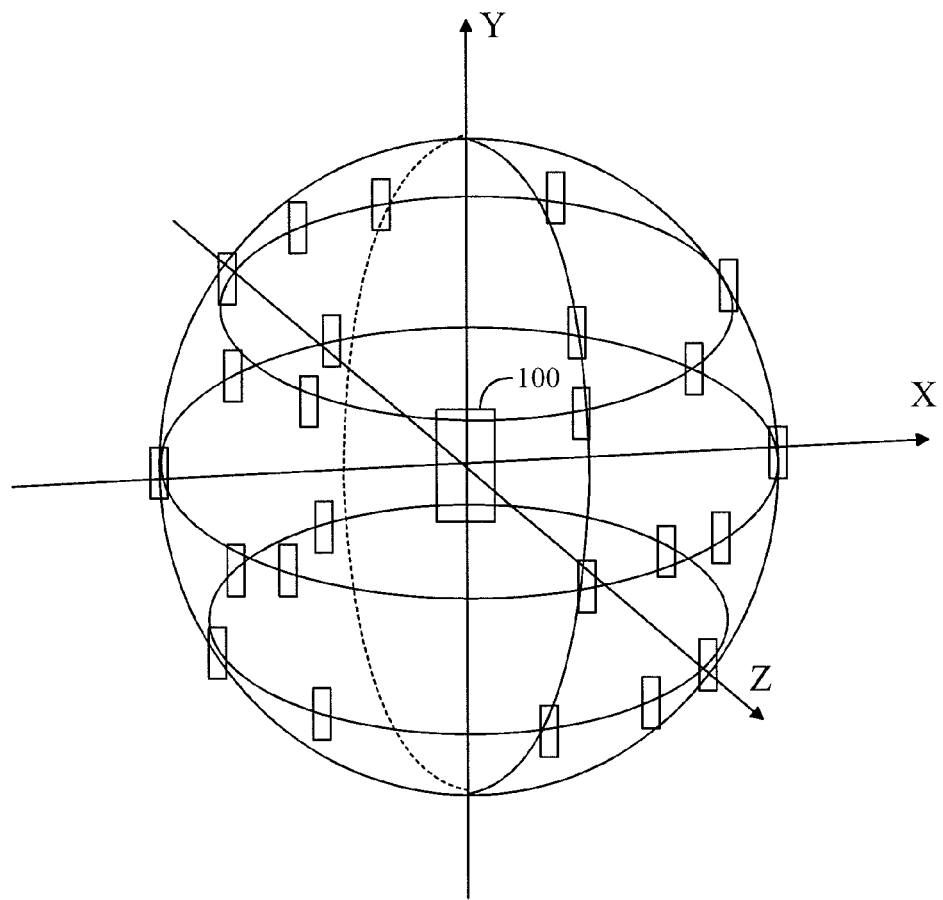
FIG. 7 shows a solid geometrical embodiment of an OTA test chamber.

FIG. 7 presents a solid geometrical embodiment of an OTA test chamber. In this example, the antenna elements (rectangles) are placed (as if) on a surface of a sphere while the DUT 100 is in the middle of the sphere. However, the surface on which the antenna elements are (as if) placed may be any surface which encloses a volume. Examples of such surfaces are a surface of a cube, an ellipsoid, a tedraedra, etc.

When antenna elements are placed 3-dimensionally around the DUT 100, the optimization may also be performed in one, two or three orthogonal dimensions. To achieve results in a solid geometry, the spatial correlation and the optimization may be calculated along at least three lines having components in all three orthogonal directions.

Figure 8:
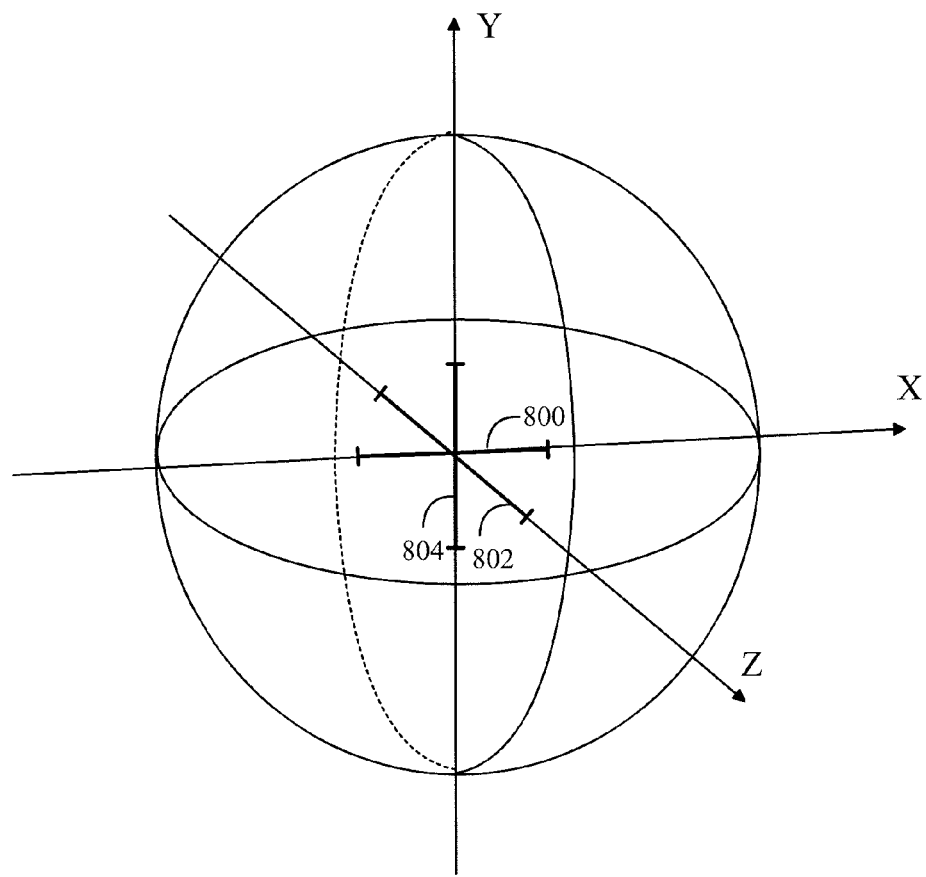
FIG. 8 shows three spatial correlation lines.

FIG. 8 presents three lines 800 to 804 for which the spatial correlation may be calculated. The length of the lines corresponds to the diameter of the quiet zone in the test spot.

Like in the plane geometrical embodiment, in a solid geometrical embodiment where the antenna elements 102 to 116 are mounted on an azimuth and elevation planes, there is a plurality of selection algorithms. The subset 180 of positions may be selected randomly, but a more realistic selection is a deterministic process.

In an embodiment, the optimization of weights G may be based on the following cost function which is similar to the two-dimensional cost function presented in equation (1):

$$E_\rho(g_1, g_2, \ldots, g_J) = \sqrt{\sum_{n=1}^{N} \sum_{m=1}^{M} W_{n,m} |\rho(\Delta_{n,m}, \varphi_n, \sigma_\varphi, \gamma_m, \sigma_\varphi) - \tilde{\rho}(\Delta_{n,m})|^2}, \quad (9)$$

where $W_{n,m}$ is an importance weight, i.e. the cost for the cost function in azimuth (n) and elevation (m) directions, $\rho(\Delta_{n,m}, \phi_n, \sigma_\phi, \gamma_m, \sigma_\phi)$ is a theoretical spatial cross correlation on a two-dimensional spatial separation $\Delta_{n,m}$ of antenna elements, $\phi_n$ is a nominal angle of arrival in azimuth direction, $\gamma_m$ is a nominal angel of arrival in elevation direction, $\sigma_\phi$ is an angular spread in azimuth direction, $\sigma_\gamma$ is an angular spread in elevation direction, and $\tilde{\rho}(\Delta_{n,m})$ is a real spatial correlation obtained with the OTA antenna elements. The optimization of equation (9) may be performed for the three orthogonal segments of lines presented in FIG. 8.

A subset 180 of positions of antenna elements may be selected from the potential positions 160 to 178 of antenna elements 102 to 116 on the basis of the optimization in similar manners to the two-dimensional embodiments.

The channel model for a MIMO OTA is a geometric antenna independent. When solid geometry in concerned, the parameters of a radio channel may be as follows:
  power (P), delay (τ),
  azimuth angle of arrival (AoA), angle spread of arrival azimuth angles (ASA), shape of clusters (PAS),
  azimuth angle of departure (AoD), angle spread of departure azimuth (ASD), shape of PAS,
  elevation angle of arrival (EoA), angle spread of arrival elevation angles (ESA), shape of PAS,
  azimuth angle of departure (EoD), angle spread of departure elevation angles (ESD), shape of PAS,
  cross polarization power ratio (XPR).

The parameters may be used in the optimization algorithm.

One of the challenges in a MIMO OTA system is to model an arbitrary power angular spectrum (PAS) with a limited number of OTA antennas. The modeling may be performed (assuming uncorrelated scattering) by transmitting independent fading signals from different OTA antennas with antenna specific power weights $g_k$ in a similar manner described above. A continuous PAS may be modeled by a discrete PAS using discrete OTA antenna elements at directions $\theta_k$.

OTA antenna parameters can be resolved by optimization. The cost function for determination of OTA antenna power weights and positions is the minimum squared error of spatial correlation $$E_\rho(\Theta, G) = \sqrt{\frac{1}{M} \sum_{m=1}^{M} |\rho(P_\varphi, \Delta_m) - \tilde{\rho}(\Theta, G, \Delta_m)|^2} \quad (10)$$

where $\Theta = \{\theta_k\}$, $\theta_k \in [0, 2\pi]$ is a vector of OTA antenna element direction, $G = \{g_k\}$, $g_k \in [0,1]$ is a vector of an OTA antenna element power weight, $\rho(P_\varphi, \Delta_m)$ is a theoretical spatial correlation, $\tilde{\rho}(\Theta, G, \Delta_m)$ is a spatial correlation obtained with parameters Θ and G, $P_\phi$ is power angular spectrum with a known shape (e.g. Laplacian), nominal angle of arrival $\phi_0$ and rms angular spread $\sigma_\phi$.

The spatial correlation $\tilde{\rho}(\Theta, G, \Delta_m)$ obtained with OTA antennas may be defined as:

$$\tilde{\rho}(\Theta, G, \Delta_m) = \left(\sum_{k=1}^{K'} g_k\right)^{-1} \sum_{k=1}^{K'} g_k \exp(-j2\pi\Delta_m \sin\theta_k) \quad (11)$$

Finally OTA antenna power weights and positions are obtained by minimization on the cost function:

$$\{\theta_1, \theta_2, \ldots, \theta_K; g_1, g_2, \ldots, g_K\} = \arg\left(\min_{\Theta \in [0, 2\pi], G \in [0,1]} (E_\rho(\Theta, G))\right) \quad (12)$$

The optimization of the cost function may be performed numerically by applying for example so called simulated annealing principle which is described in William H. Press, "Numerical Recipes in C—The Art of Scientific Computing", Cambridge university press, Second Edition (1992).

Often the OTA antenna elements are in fixed positions and thus directions $\theta_k$ are fixed. The optimization problem reduces to selection of an optimum sub-set of antenna elements and to determination of optimum power weights $g_k$. In the case of moving antenna elements, the antenna elements are moved to the positions corresponding to the directions $\theta_k$.

Outputs of the application may be indices and positions of the K selected OTA antennas. Indices may be in a vector form. An example of the content of the vector v indicating the selected antenna elements the number K of which is 16.

$$v=[4\ 7\ 10\ 15\ 17\ 19\ 21\ 22\ 23\ 24\ 25\ 27\ 29\ 32\ 45\ 48]$$

The potential number J of antenna elements in this example is 48. Positions of the K selected OTA antenna elements may also be in a vector form. An example content of the vector $v_{theta}$ of K=16 selected antennas may be $$v_{theta}=[22.5\ 45\ 67.5\ 105\ 120\ 135\ 150\ 157.5\ 165\ 172.5\ 180\ 195\ 210\ 232.5\ 330\ 352.5]$$

The vector $v_{theta}$ corresponds to the vector v.

Figure 9:
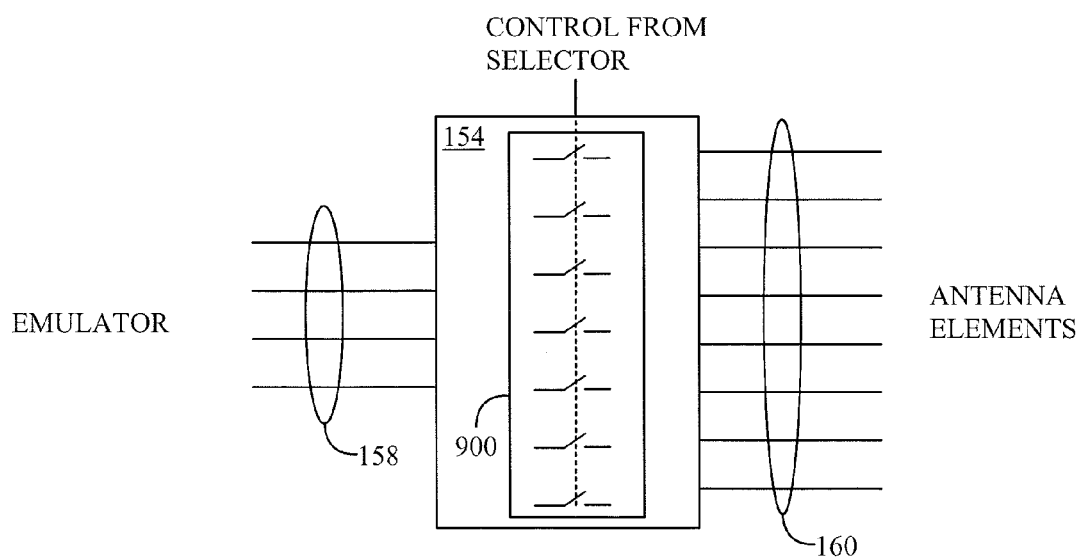
FIG. 9 shows a connector.

FIG. 9 presents a connector. The connector 154 may comprise switches 900 for each connection between a selected antenna element and an output of the emulator 150. The switches 900 may be turned open to disconnect the emulator 150 and an antenna element placed in the subset 180 or they may be turned closed to connect the emulator 150 and an antenna element placed in the subset 180. The states of the switches may be controlled by the selector 152. The selector may select a number of positions of the subset 180 for the antenna elements equal to or less than a number of the antenna elements to which the simulated radio channel is inputtable at a time by the emulator 150. Similarly, the selector may select a number of positions of the subset 180 for the antenna elements equal to or less than a number of the antenna elements from which the simulated radio channel is receivable at a time by the emulator 150.

The selector 152 and the connector 154 may be parts in a switching system which may be placed between an emulator 150 and a plurality of antenna elements 102 to 116. As already explained the selector 152 may receive data on the simulated radio channel from the emulator 150 and select the subset 180 of positions from the plurality of positions for the antenna elements 102 to 116 for connection on the basis of the data. The connector 154 may connect the subgroup of antenna elements belonging to the subset 180 and the emulator 150 for physically realizing the simulated radio channel. The potential antenna elements outside the subgroup are disconnected from the emulator 150.

At each moment when a subset 180 is selected, a geometric radio channel model in the emulator 150 is mapped on a subset 180 of the positions of the OTA antenna elements 102 to 116. This may take place such that each antenna element placed in the subset 180 receives a signal through an antenna-specific channel from the emulator 150 and transmits it wirelessly to the DUT 100. Since each signal component associated to a path, i.e. to a delay of the multipath propagation may come to the DUT 100 from the same or from a different direction, the emulator 150 distributes the signal it receives to each antenna element placed in positions belonging to the subset 180 according to the radio paths of the channel model at each moment. The radio channel model determines the power and the delay of each antenna-specific signal. A corresponding principle applies to a signal transmitted in the opposite direction.

In a simple embodiment, a signal of one path may be transmitted to the DUT 100 from one antenna element of the subgroup only and hence the direction of a beam 120 representing the path has to be approximated with the angle $\theta_k$ of the antenna element of the subgroup closest to the direction of the path.

When the angle of a path differs from the angle $\theta_k$ of the antenna element of the subgroup by more than a predetermined threshold value of the emulating system, which may be for example 1°, the beam may be transmitted using at least two antenna elements of the subgroup.

In an embodiment, the power of a signal of a simulated path may be divided between two antenna elements of a subgroup on the basis of antenna angles $\theta_k$ and an angle $\phi$ of a direction of the path.

Additionally, noise and interference may be added to the simulated radio channel. Also polarization effects may be used, if the antenna elements 102 to 116 and the DUT 100 support the use of polarized radiation.

Figure 10:
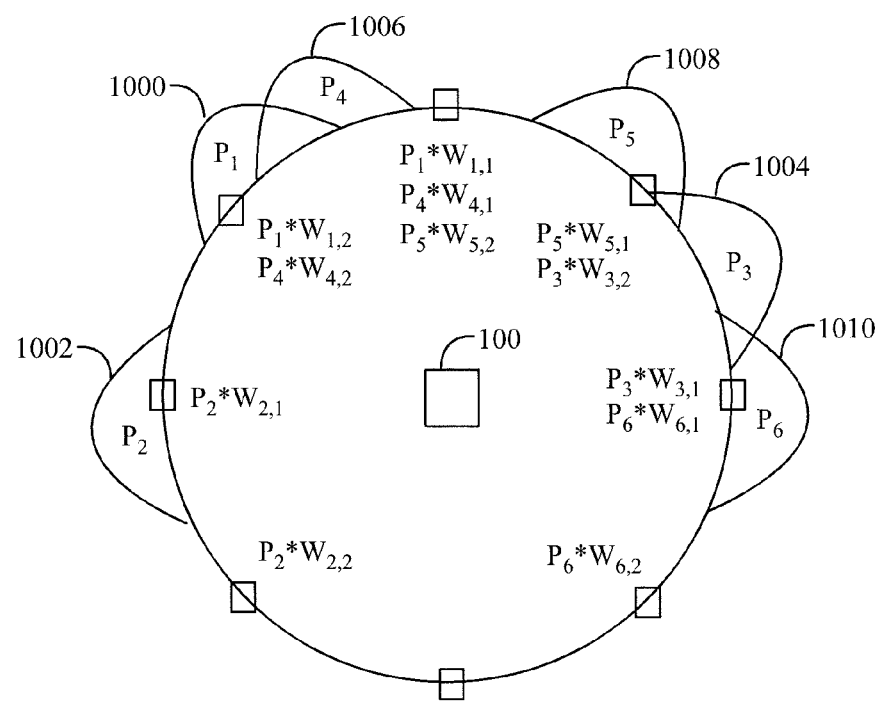
FIG. 10 shows beams and powers distributed for different antenna elements.

FIG. 10 presents six beams 1000 to 1010. One weight $g_i$ may be for one antenna element when one antenna element is used to form one beam of a cluster. In general, when more than one antenna elements are used to form one beam at a certain direction $\phi$, a weight $g_i$ may be determined as $g_i = \sum_{n=1}^{N} w_{n,i}$ where $w_{n,i}$ is a weight for an antenna element n,i and N is a number of antenna elements used for one beam i. In such a case, an antenna element may comprise more than one sub-element or at least two antenna elements are used due to a fact that a selected direction of a beam differs from the direction of a single antenna element.

Next an example of selection of OTA antennas in a 2 dimensional space is explained. The application, which may be a computer program for numerical computing, may select an optimum sub-set of OTA antenna elements from a given set of OTA antennas on the basis of a given radio channel model. Outputs of the application may be indices and positions of the K selected OTA antenna elements. Inputs to the application may be a power angular spectrum of a channel model, positions of the J original OTA antenna elements, and a size of a target quiet zone. A target number K of OTA antenna elements may also be on input. Since spatial characteristics may form the basis of the selection criteria in the antenna selection algorithm, polarization and other radio channel dimensions may be neglected.

The input parameters may be typed into a file as shown in the following example. Channel model parameters may be: number of clusters (taps) in the channel model (for example 6), cluster (tap) power (for example in dB [0 −2.7 −1.3 −4.3 −6.0 −8.4]), angle of arrival of clusters (for example in degrees [0.7 146.1 −13.2 −30.5 −11.4 −1.1]), cluster-wise rms angular spread of arrival (for example in degrees [35 35 35 35 35 35]).

Parameters associated with OTA antenna elements may be as follows: the number of OTA antenna elements (for example 48 but in general, the number of OTA parameters is not limited to any specific number), OTA antenna sites (for example in degrees [0:7.5:359], which means that antenna elements have angular spacing of 7.5°), size of DUT antenna (quiet zone) (for example in wavelengths 5) which defines the minimum size of the quiet zone, number of emulator outputs which is the same as the target number of OTA antenna elements (for example 16), identification, i.e. the name of the user defined channel model (for example 'J=48, K=16, SCME Urban macro'). Sites of OTA antenna may be freely selected but the length of the vector must be equal to the number of OTA antenna elements. These parameters are also shown in Table 1.

TABLE 1

Ranges of input and output values

| NAME | DESCRIPTION |
| --- | --- |
| no of clusters | 1-24 |
| Power | −infinity-0 dB |
| AoA | 0-360 deg |
| Asa | 0-104 deg |
| No. of antenna elements | 1-48 |
| antenna sites | arbitrary positions |
| quiet zone size | 0-infinity |
| Outputs | 1-number of antenna elements |
| otapar.filename | any valid string |

Figure 11:
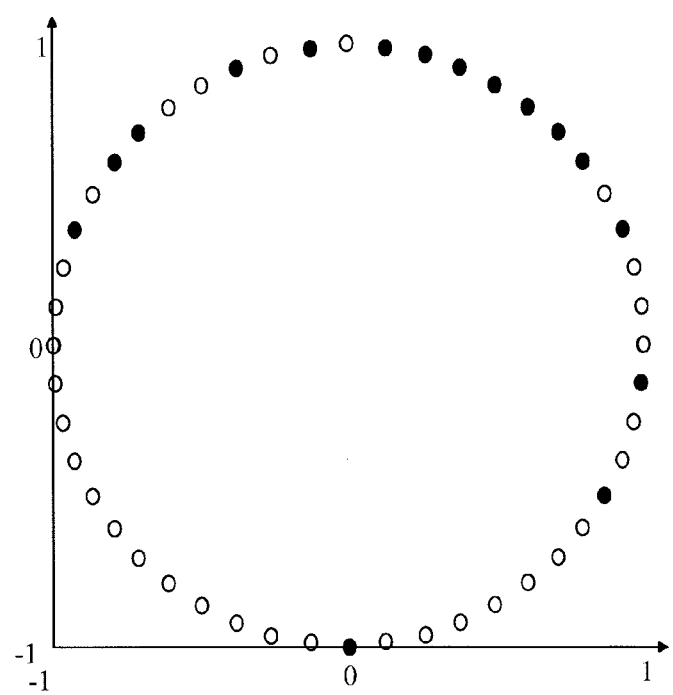
FIG. 11 shows selected antenna elements among all antenna elements.

FIG. 11 presents J (48 in this example) antenna elements marked with white and black dots in an OTA chamber. K (16 in this example) antenna elements marked with black dots have been selected using the optimization algorithm described above.

Figure 12:
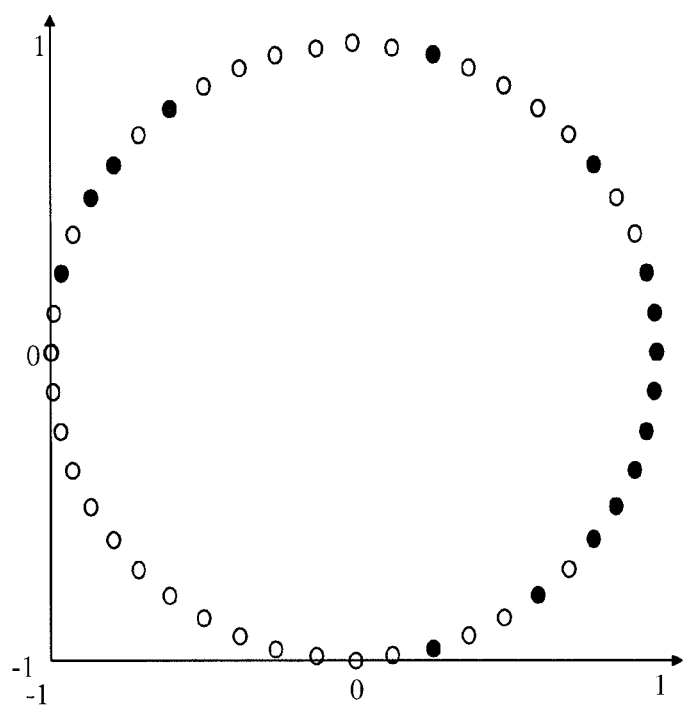
FIG. 12 shows another selection of antenna elements among all antenna elements.

FIG. 12 presents another example of J (48 in this example) antenna elements marked with white and black dots in an OTA chamber. Different K (16 in this example) antenna elements marked with black dots with respect to FIG. 11 have been selected using the optimization algorithm described above.

Figure 13:
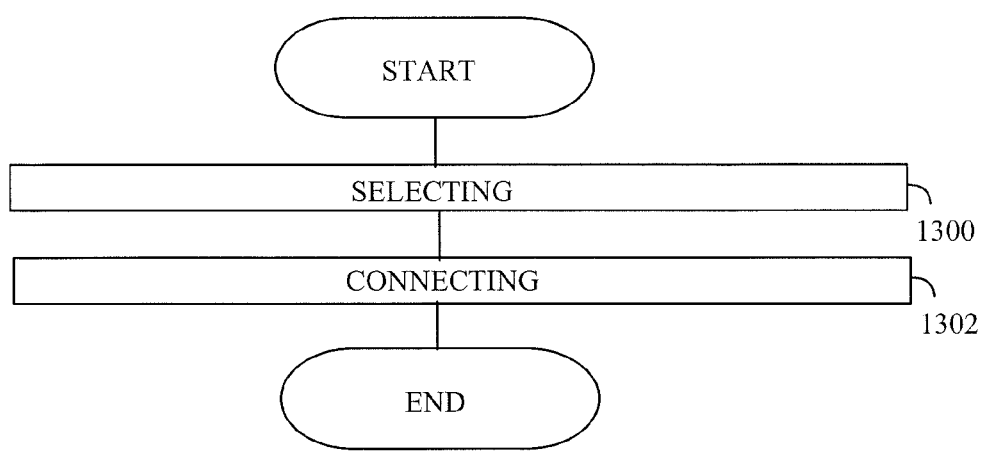
FIG. 13 shows a flow chart of the method.

FIG. 13 presents a flow chart of the method. In step 1300, a subset 180 of positions of antenna elements is selected from a plurality of potential positions 160 to 178 of antenna elements of an over-the-air test around the device under test on the basis of a simulated radio channel. In step 1302, only the antenna elements in the subset 180 and the radio channel emulator are connected for physically realizing the simulated radio channel.

The emulator 150 and/or the selector 152 may generally include a processor, connected to a memory. Generally the processor is a central processing unit, but the processor may also be an additional operation processor. The processor may comprise a computer processor, ASIC (Application-Specific Integrated Circuit), FPGA (Field-Programmable Gate Array), and/or other hardware components that have been programmed in such a way to carry out one or more functions of an embodiment.

The memory may include volatile and/or non-volatile memory and typically stores data. For example, the memory may store a computer program code such as software applications or operating systems, information, data, content for the processor to perform steps associated with operation of the apparatus in accordance with embodiments. The memory may be, for example, RAM (Random Access Memory), a hard drive, or other fixed data memory or storage device. Further, the memory, or part of it, may be removable memory detachably connected to the emulating system.

The techniques described herein may be implemented by various means. For example, these techniques may be implemented in hardware, firmware, software, or combinations thereof. For a firmware or software, implementation can be through modules that perform the functions described herein. The software codes may be stored in any suitable, processor/computer-readable data storage medium(s) or memory unit(s) or article(s) of manufacture and executed by one or more processors/computers. The data storage medium or the memory unit may be implemented within the processor/computer or external to the processor/computer, in which case it can be communicatively coupled to the processor/computer via various means as is known in the art.

The embodiments may be applied in 3GPP (Third Generation Partnership Project) LTE (Long Term Evolution), WiMAX (Worldwide Interoperability for Microwave Access), Wi-Fi and/or WCDMA (Wide-band Code Division Multiple Access). The MIMO is also a possible field of application.

It will be obvious to a person skilled in the art that, as technology advances, the inventive concept can be implemented in various ways. The invention and its embodiments are not limited to the examples described above but may vary within the scope of the claims.

What is claimed is:

1. A method, the method comprising:
   selecting a subset of positions of antenna elements from a plurality of potential positions of antenna elements around a device under test on the basis of a simulated radio channel of a plurality of paths in an over-the-air test; and
   connecting only the antenna elements in the subset and a radio channel emulator together for physically realizing the simulated radio channel.

2. The method of claim 1, the method further comprising selecting a subgroup of antenna elements from the plurality of the antenna elements in fixed positions around the device on the basis of the positions of the antenna elements with respect to the simulated radio channel; and
   performing the connection between the subgroup and the radio channel emulator for physically realizing the simulated radio channel.

3. The method of claim 1, the method further comprising selecting the subset from the potential positions of the antenna elements on the basis of a size of a quiet zone achievable with the simulated radio channel and antenna elements of various subsets.

4. The method of claim 1, the method further comprising selecting the subset from the potential positions of the antenna elements by an optimization of an error between a theoretical spatial cross correlation and a real spatial correlation achievable with antenna elements of various subsets in the optimization.

5. The method of claim 1, the method further comprising selecting the subset on the basis of data on an angular distribution of the simulated radio channel between the emulator and the device under test.

6. The method of claim 2, the method further comprising selecting the subset for a number of the antenna elements equal to or less than a number of the antenna elements which the simulated radio channel is receivable from or inputtable to at a time by the emulator, the number of antenna elements in the subset being less than the number of the plurality of the antenna elements.

7. The method of claim 1, the method further comprising forming a predetermined number of antenna-element-specific channels of the simulated radio channel in the emulator for connecting each antenna-element-specific channel to an antenna element in a position of the subset.

8. The method of claim 1, the method further comprising selecting the subset of positions from the potential positions of the antenna elements distributed around the device under test in solid angles.

9. The method of claim 1, the method further comprising selecting the subset of positions from the potential positions of the antenna elements distributed around the device under test in plane angles.

10. A connection system, the connection system comprising a selector placable between an emulator and a plurality of antenna elements around an electronic device under test for a wireless connection between the electronic device under test and the emulator through a simulated radio channel of a plurality of paths of the emulator; and the selector is configured to receive data on the simulated radio channel from the emulator and to select a subset of positions of antenna elements from a plurality of potential positions of antenna elements for connection on the basis of the data.

11. The connection system of claim 10, wherein the selector is configured to select a subgroup of antenna elements from the plurality of the antenna elements in fixed positions around the device on the basis of the positions of the antenna elements.

12. The connection system of claim 10, wherein the selector is configured to select the subset from the potential positions of the antenna elements on the basis of a size of a quiet zone achievable with the simulated radio channel and antenna elements of various subsets.

13. The connection system of claim 10, wherein the selector is configured to select a subset of positions from the plurality of the potential positions of the antenna elements by an optimization of an error between a theoretical spatial cross correlation and a real spatial correlation achievable with antenna elements of various subsets in the optimization.

14. The connection system of claim 10, wherein the selector is configured to select the subset with a number of antenna positions equal to or less than a number of the antenna elements which the simulated radio channel is receivable from or inputtable to at a time by the emulator.

15. The connection system of claim 10, wherein the selector is configured to select the subset of positions from the plurality of potential positions of the antenna elements distributed around the device under test in solid angles.

16. The connection system of claim 10, wherein the selector is configured to select the subset of positions from the plurality of potential positions the antenna elements distributed around the device under test in plane angles.

17. An emulating system of an over-the-air test, the emulating system comprising a radio channel emulator, a selector, a connector and a plurality of antenna elements placed around a test spot for an electronic device under test;

the selector is configured to receive data on the simulated radio channel of a plurality of paths from the emulator and to select a subset of positions of antenna elements from a plurality of potential positions of antenna elements for connection on the basis of the data; and the connector is configured to connect only the antenna elements of the subset and the radio channel emulator for physically realizing the simulated radio channel.

18. The emulating system of claim 17, wherein the selector is configured to select a subgroup of antenna elements from the plurality of the antenna elements in fixed positions around the device on the basis of the positions of the antenna elements.

19. The emulating system of claim 17, wherein the selector is configured to select the subset from the potential positions of the antenna elements on the basis of a size of a quiet zone achievable with the simulated radio channel and antenna elements of various subsets.

20. The emulating system of claim 17, wherein the selector is configured to select the subset of the positions of the antenna elements from the plurality of the potential positions of the antenna elements by an optimization of an error between a theoretical spatial cross correlation and a real spatial correlation achievable with antenna elements of various subsets in the optimization.

21. The emulating system of claim 17, wherein the selector is configured to select the subset with a number of antenna positions equal to or less than a number of the antenna elements which the simulated radio channel is receivable from or inputtable to at a time by the emulator.

22. The emulating system of claim 17, wherein the selector is configured to select a subset of positions from the plurality of potential positions distributed around the device under test in solid angles.

23. The emulating system of claim 17, wherein the selector is configured to select a subset of positions from the plurality of potential positions distributed around the device under test in plane angles.

* * * * *